United States Patent [19]

Friend

[11] Patent Number: 5,110,167
[45] Date of Patent: May 5, 1992

[54] DISC HANDLING DEVICE, METHOD OF USE AND PACKAGE

[76] Inventor: Robert N. Friend, 1308 Willow Ave., Melrose Park, Pa. 19026

[21] Appl. No.: 534,803

[22] Filed: Jun. 7, 1990

[51] Int. Cl.⁵ .......................... B25J 15/08; B25B 9/00
[52] U.S. Cl. ........................................ 294/16; 294/28; 294/31.1
[58] Field of Search ............... 294/5, 6, 8.5, 11, 12, 294/13, 16, 27.1-31.1, 32, 33, 99.2, 104, 106, 118, 165

[56] References Cited

U.S. PATENT DOCUMENTS

| | | | |
|---|---|---|---|
| 703,192 | 6/1902 | Gueth | 294/31.1 X |
| 1,365,227 | 1/1921 | Clark | 294/16 X |
| 1,475,883 | 11/1923 | Rogers | 294/13 |
| 1,511,128 | 10/1924 | Hosking | 294/31.1 |
| 2,618,499 | 11/1952 | Scharf | 294/28 |
| 2,723,877 | 11/1955 | Palmour et al. | 294/28 X |
| 2,990,213 | 6/1961 | Kolacinski | 294/28 X |
| 3,042,439 | 7/1962 | King | 294/30 |
| 3,281,179 | 10/1966 | Miller | 294/16 |
| 4,461,193 | 7/1984 | Gruber et al. | 294/16 X |
| 4,595,221 | 6/1986 | de Geus et al. | 294/16 |
| 4,662,667 | 5/1987 | Gilligan et al. | 294/16 |
| 4,726,615 | 2/1988 | Goldberg | 294/16 |
| 4,997,224 | 3/1991 | Pierce | 294/16 |

FOREIGN PATENT DOCUMENTS 288890  6/1914  Fed. Rep. of Germany ........ 294/16

*Primary Examiner*—Johnny D. Cherry

[57] ABSTRACT

A device for handling discs such as compact and other discs, method of use and packaging, the device comprising a handle for holding and actuating the device, a first and second arm connected to the handle at a juncture, each arm comprising a distal end having a gripper and a proximal end where the arms are movably attached to each other. The device also comprises a pivot for pivoting the arms in response to actuation of the handle which is located between the juncture of the handle means and the arms. Pressure is applied to the handles so that their inner surfaces move closer together causing the grippers on the arms to pivot away from each other about a pivot so that the grippers may be located about the disc edge. The applied pressure is released so that the grippers engage the edge of the disc which is then removed from its container or other surface.

5 Claims, 2 Drawing Sheets

DISC HANDLING DEVICE, METHOD OF USE AND PACKAGE

BACKGROUND OF THE INVENTION

This invention relates generally to a disc handling device and method of use for handling discs such as compact discs, record albums, optical discs, and video discs. Music and other types of informational signals are digitized and then recorded on a disc such as the compact disc, also known as a "CD." However, the invention is specifically directed to the handling of compact discs.

In order to play back music or other signals stored on a compact disc for example, the disc is inserted into a player which utilizes a laser beam to read the stored information and translate it into an electrical signal. The electrical signal is then translated into an audible signal which may be heard through a speaker. In order for the laser beam to correctly and accurately read the information stored on a compact disc and permit the player to reproduce the signals stored on it, the disc must be free from dirt, defects and damage.

Compact discs are typically sold in a plastic box which stores the compact disc and protects it from such hazards as dirt, fingerprints, scratching, etc., which interfere with the quality of sound reproduction. The plastic box is usually shaped like a hinged book and typically has a central plastic core which secures the central hole in the disc to hold the disc securely within a circular recess in the box. To remove the disc from the storage box and insert it in a player, an individual must grasp at least the edge of the disc. However, oftentimes a person may inadvertently touch portions other than the edge, which leaves fingerprints and/or smudges on the disc. Further, the person may drop or scratch the disc causing permanent damage, all which interfere with the quality of sound reproduction.

One prior art compact disc handling device is that disclosed in U.S. Pat. No. 4,726,615 (Goldberg). However, this device is believed to be difficult to operate, and complex and expensive to manufacture, since it relies on a central plunger, cam system and several movable arms to handle the disc.

Accordingly, a need exists for a disc handling device which is reliable, simple in design and to use, and inexpensive to manufacture.

OBJECTS OF THE INVENTION

Accordingly, it is a general object of this invention to provide a device which facilitates handling of a disc without the disc contacting a person's hands.

It is a further object of this invention to provide a disc handling device which is easy to use, reliable and inexpensively manufactured.

It is yet still a further object of this invention to provide a disc handling device which is small enough to be packaged in a typical compact disc package.

It is a further object of this invention to provide a method of using a disc handling device which is simple, reliable and easy to use.

SUMMARY OF THE INVENTION

These and other objects of this invention are achieved by providing a device and method of use for handling discs such as compact and other discs comprising handle means for holding and actuating the device, a first and second arm connected to the handle means at a juncture, each of the first and second arms comprising a proximal end and a distal end having a gripper means for gripping the edge of the disc. The arms are movably attached to each other at their proximal ends by pivot means located between the juncture of the handle means and the arms for pivoting the arms and gripper means in response to actuation of the handle means.

DESCRIPTION OF THE DRAWINGS

Other objects and many attendant features of this invention will become readily appreciated as the same becomes better understood by reference to the following detailed description when considered in connection with the accompanying drawings wherein.

DETAILED DESCRIPTION OF THE PREFERRED EMBODIMENT

Figure 1:
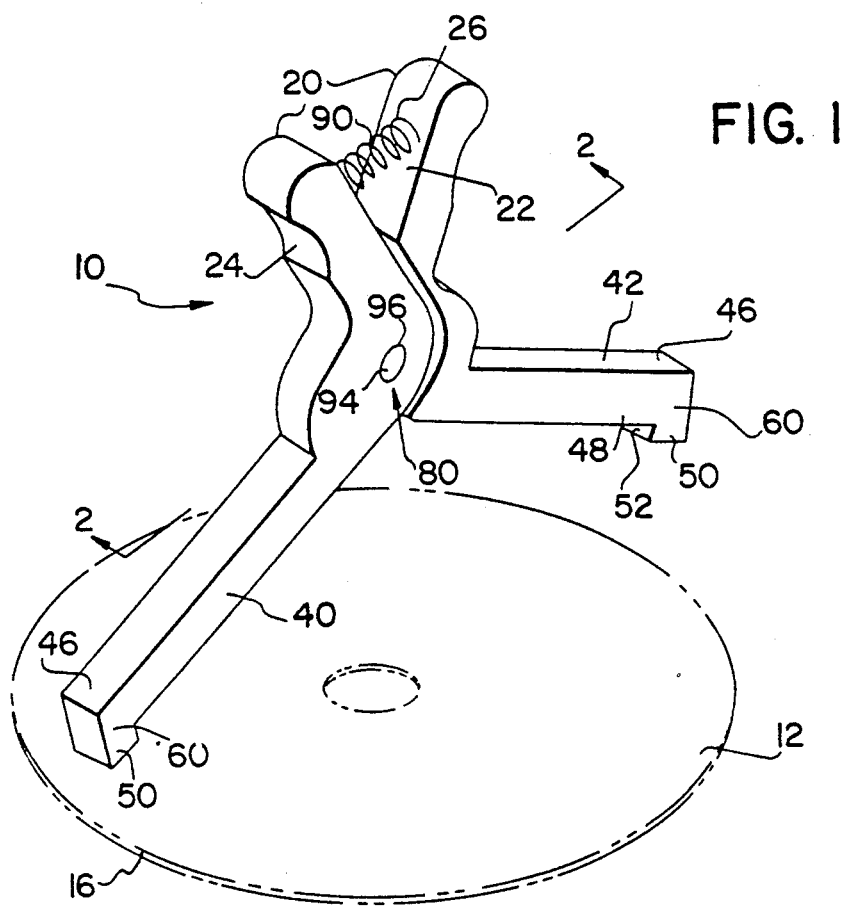
FIG. 1 is an isometric view of a device constructed in accordance with this invention.
Figure 4:
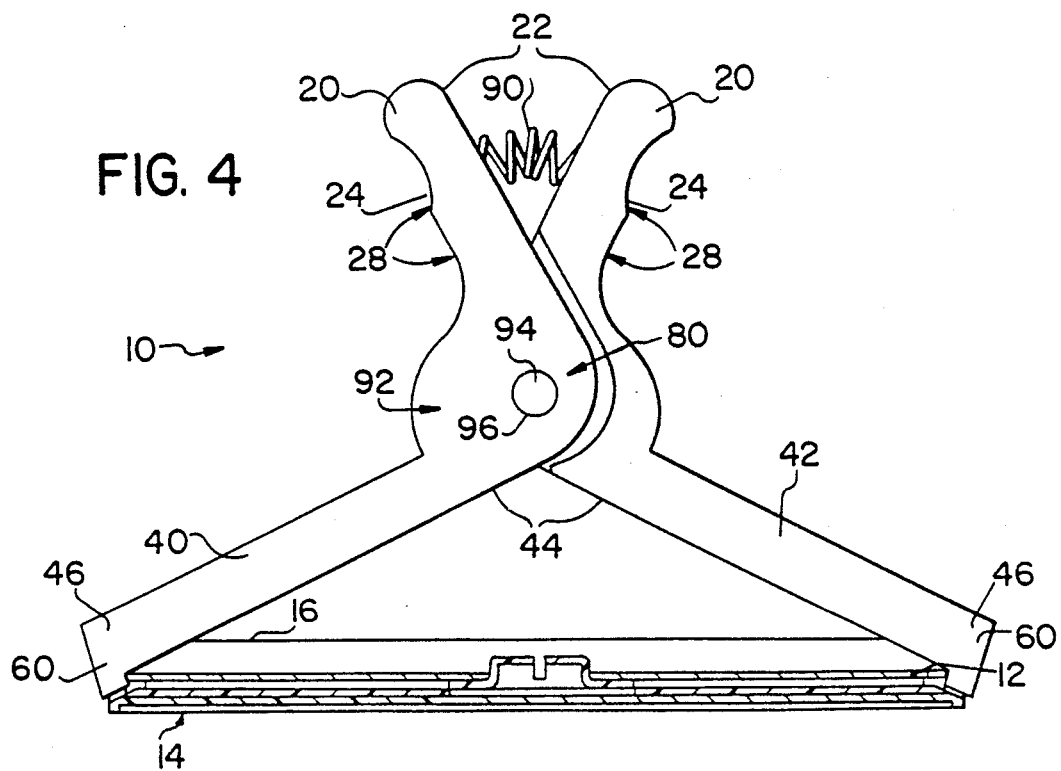
FIG. 4 is a side elevation view of the device of the present invention shown gripping a compact disc shown in section.

Referring now to various figures of the drawings where like reference numerals refer to like parts there is shown at 10 in FIGS. 1 and 4, a device constructed in accordance with this invention, shown gripping a compact disc 12 from a compact disc plastic storage box 14.

The device 10, basically comprises handles 20 for holding and actuating the device, a first and second arm 40 and 42, grippers 60 for gripping the edge 16 of disc 12 and a pivot 80 for pivoting the arms, all to be described in further detail later. Suffice it to say for now that a person actuates the device by applying pressure to the handles 20 which causes the arms 40 and 42 to pivot about the pivot 80, causing the grippers 60 to be circumferentially adjacent the disc edge 16 as spring 90 is compressed. When the pressure is removed, the grippers 60 securely grip the edge 16 of the disc 12, permitting the person to lift the disc 12 out of the compact disc plastic box 14 by lifting the device 10 in a vertical direction. Thus, the device 10 is in the normally closed or disc gripping condition.

As shown clearly in FIGS. 1 and 4, the handles 20 have inner surfaces 22 and outer surfaces 24. The inner surfaces 22 additionally comprise a spring recess 26 for retaining spring member 90 which assists the user in actuating the device as described in detail later. Additionally, the outer surfaces 24 preferably have finger indents 28 to facilitate gripping of the device by a person during use.

The handles 20 are pivotally connected at a juncture 92 to each of the proximal ends 44 of the first and second arms 40 and 42 by a pivot pin 94. Each of the arms 40 and 42 comprises a proximal end 44 and distal end 46 with gripper 60 for gripping the edge(s) 16 of the disc 12. The pivot pin 94 is used to pivot the first and second arms 40 and 42 in response to actuation of the handles 20. The pivot pin 94 is inserted into and retained by pivot retaining openings 96 in each of the handles 40 and 42 at juncture 92.

Figure 2:
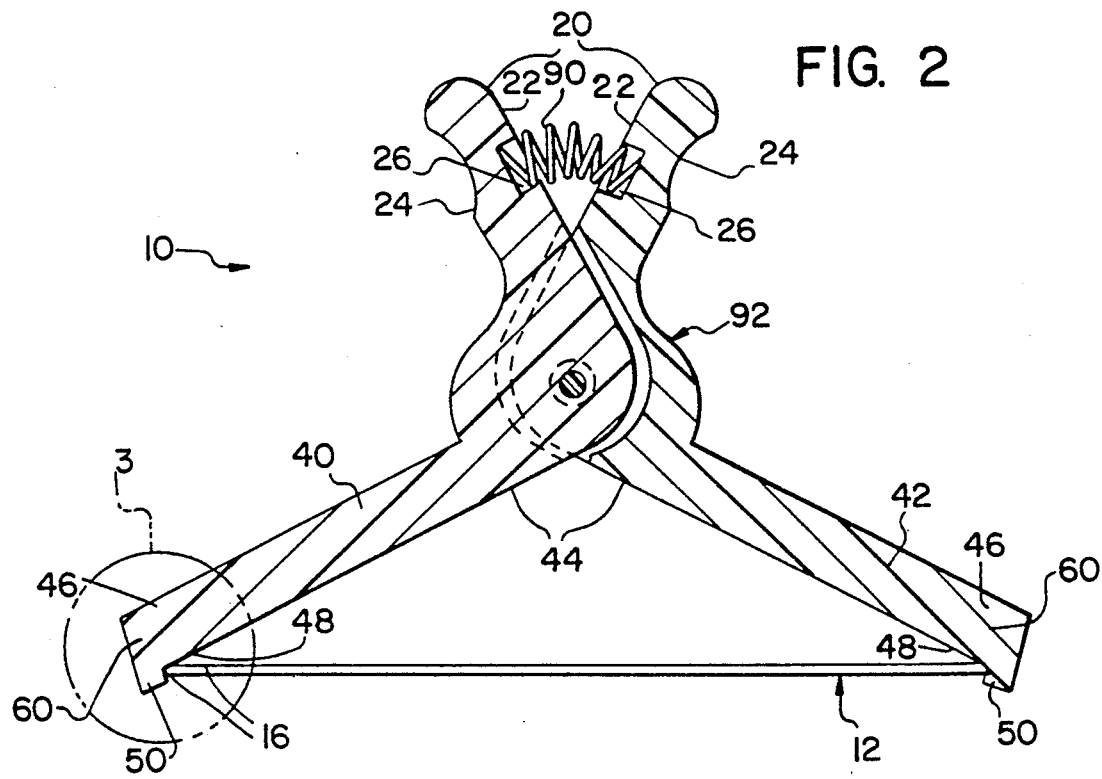
FIG. 2 is a side elevation view in section of the device taken along line 2—2 of FIG. 1.
Figure 3:
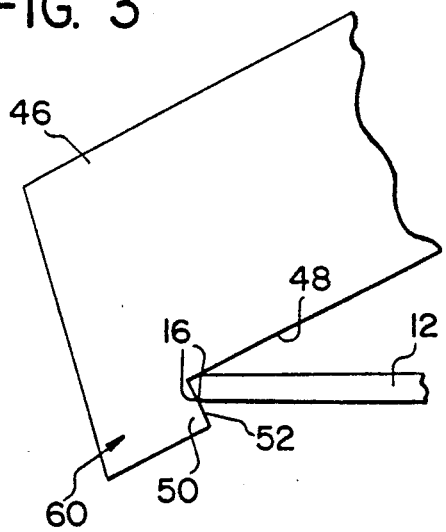
FIG. 3 is a partial exploded view of the gripper of FIG. 2.

In the preferred embodiment, as shown in FIGS. 1, 2 and 4, the device additionally comprises a spring member 90 contained within spring recesses 26 which aids in positioning the handles 20 and the grippers 60. When pressure is applied to the outer surfaces 24 of handles 20 by a person's fingers, the spring member 90 is compressed as grippers 60 move outward to circumferentially engage the disc edge 16. When the pressure on outer surfaces 22 is decreased, the spring tension causes the grippers 60 to move towards one another and grip the disc edge 16 as shown in FIGS. 3 and 4. The disc 12 is now releasably secured for removal from the plastic box 14 or disc player (not shown).

The grippers 60 which grip the disc edge 16 are located on the distal ends 46 of the arms 40 and 42. As shown in FIGS. 3 and 4, the distal ends 46 comprise first inner surfaces 48 while the grippers 60 also comprise an extended portion 50 at each distal end. The extended portions 50 have second inner surfaces 52. The planes of the second inner surfaces 52 are at a predetermined angle to the planes of the first inner surfaces 48. In the preferred embodiment of the device, the predetermined angle is preferably ninety degrees (90°) in order to more securely grip the disc edge 16. As shown in FIG. 3, the corners of the disc edge are in point contact with surfaces 48 and 52. The angle between the surfaces 48 and 52 may vary within a range of sixty degrees (60°) to one hundred fifty degrees (150°), although the invention is not so limited.

Figure 5:
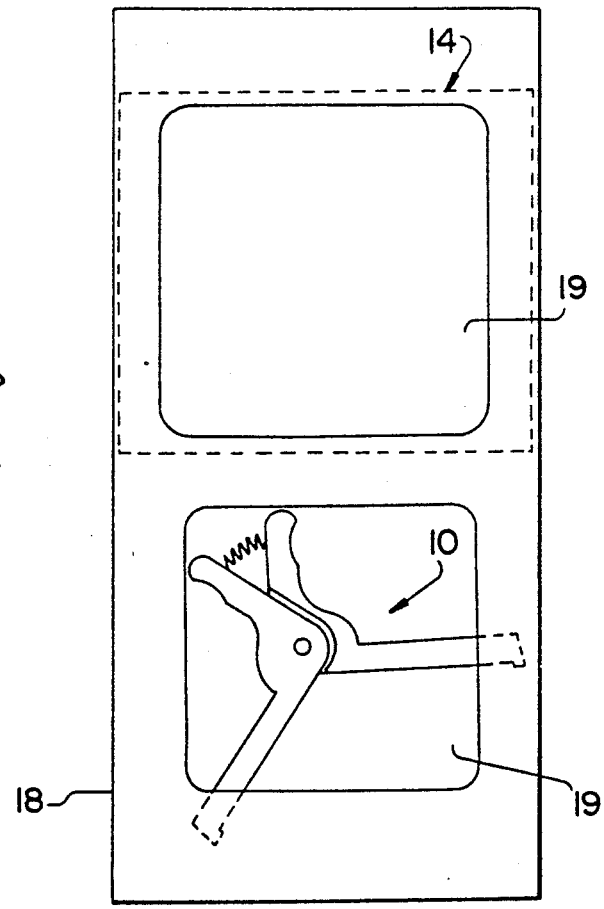
FIG. 5 is a top planar view of the device of the present invention as packaged in a compact disc package of the present invention.

As shown in FIG. 5, the device 10 of the present invention is preferably compact enough to be enclosed in the thin packaging 18 which may be used to package compact discs 12. However, it should be readily apparent to those skilled in the art that larger devices may also be constructed for use with larger discs such as optical and video discs. Although any suitable materials may be used in the construction of the device, in order to decrease manufacturing and assembly costs it is preferable that the device 10, except for spring 90, be comprised of a somewhat rigid but impact resistant plastic such as polystyrene. Additionally, it is preferable to use a conventional spring, whose characteristics may be adjusted in accordance with the specific conditions and methods of use.

The packaging 18 may be comprised of any suitable packaging material or combination thereof, such as cardboard, plastic, etc., and is preferably of the approximate dimensions 0.5 inches high by 5.75 inches wide by 12 inches long. Additionally, the packaging contains windows 19 made of any resilient, transparent material so that a consumer or user may view printed material (not shown) on the disc box 14 and the device 10 contained within packaging 18 on both or any sides of packaging 18.

The method of handling and moving discs which contain information comprises the steps of providing a disc 12 contained on a surface and a disc handling device 10 comprising handles 20 with inner and outer surfaces 22 and 24 connected to a juncture 92 having a pivot 94. The inner surfaces 22 have a spring recess 26 for retaining a spring member 90. The first and second arms 40 and 42 are connected to the pivot 94 and have proximal ends 44 and distal ends 46 to which are attached grippers 60 for gripping the edge 16 of a disc 12. Pressure is applied to the handles 20 on the device 10 so that the inner surfaces of the handles 22 move closer together causing the grippers 60 on the arms of the device to pivot away from each other about a pivot 92 so that the grippers may grip the edge of the disc. The pressure applied to the handles 20 is then released so that the grippers 60 engage the edge 16 of the disc 12. The device 10 releasably securing the disc 12 is then lifted so that the disc is removed from the surface upon which it lies such as a CD player, storage box or any other surface.

Without further elaboration, the foregoing will so fully illustrate my invention that others may, by applying current or future knowledge, readily adapt the same for use under various conditions of service.

I claim:

1. A device for handling and moving relatively fragile, flexible discs, of substantial diameter, wherein said discs have an upper edge and a lower edge, said device comprising: (a) handle means for actuating the device, (b) a first and second substantially straight arm connected to said handle means at a juncture and generally extending away from each other, each of said first and second arms comprising a distal end, a proximal end and a gripper means for gripping the upper and lower edges of the disc, said gripper means being attached to each of the distal ends, the first and second arms being movably attached to each other at their proximal ends, said gripper means including a first inner surface on each of the first and second arms which meet in an obtuse angle whereby discs of substantial diameter can be handled by said device, and said gripper means also including a second inner surface extending from each of said distal ends, each said second inner surface being at an angle of approximately 90° to a respective first inner surface, the first and second inner surfaces of said gripper means making point contact with a portion of said upper and lower edges of said disc to confine said disc edge portion between said first and second inner surfaces. (c) pivot means for pivoting said first and second arms in response to actuation of said handle means, said pivot means being located at the juncture of said handle means and said first and second arms, and spring means normally urging said first and second arms toward each other whereby said relatively fragile, flexible discs of substantial diameter are handled and moved from a first location to a second location.

2. The device of claim 1 wherein the handle means comprises two handles, pivotally mounted about said pivot means and a positioning means for positioning the two handles and the gripper means.

3. The device of claim 2 wherein said positioning means comprises a spring which is mounted in a spring recess in each of said inner surfaces.

4. The device of claim 3 wherein outer surfaces of said handles additionally comprise finger detents.

5. The device of claim 4 wherein said gripper means comprises a gripper located on each distal end of said first and second arms, and said pivoting means comprises a pivot pin mounted into openings in, and extending into said juncture, so that when the inner surfaces of said handle means are brought closer together by applying pressure to the outer surfaces of said handles, said grippers move away from each other and when said pressure is removed, said grippers move closer to each other to engage the edge of said disc.

* * * * *